United States Patent [19]

Shi et al.

[11] Patent Number: 5,757,695
[45] Date of Patent: May 26, 1998

[54] MRAM WITH ALIGNED MAGNETIC VECTORS

[75] Inventors: Jing Shi; Theodore Zhu. both of Chandler; Saied N. Tehrani. Tempe. all of Ariz.

[73] Assignee: Motorola, Inc., Schaumburg, Ill.

[21] Appl. No.: 795,488

[22] Filed: Feb. 5, 1997

[51] Int. Cl.$^6$ .................................................. G11C 11/10
[52] U.S. Cl. ............................. 365/158; 365/66; 365/97; 365/98
[58] Field of Search ........................... 365/158, 97, 98, 365/66

[56] References Cited

U.S. PATENT DOCUMENTS 3,448,438  6/1969  Hansen et al. ....................... 365/97
5,343,422  8/1994  Kung et al. ......................... 365/158

*Primary Examiner*—David C. Nelms
*Assistant Examiner*—Hoai V. Ho
*Attorney, Agent, or Firm*—Eugene A. Parsons

[57] ABSTRACT

A multi-layer magnetic memory cell is provided, with magnetic vectors aligned along a length of the cell. To align the magnetic end vectors, an ellipsoidal shape is formed at the ends of the memory cell. Magnetic vectors aligned along the length prevent from forming high fields and magnetic poles at the discontinuity or ends of the layers. The memory cell with the ellipsoidal shape shows a constant magnetic resistance of the magnetic cell when a magnetic field is applied to the cell and attains a reduction of power consumption for the magnetic cell.

7 Claims, 2 Drawing Sheets

MRAM WITH ALIGNED MAGNETIC VECTORS

FIELD OF THE INVENTION

The present invention pertains to a magnetic random access memory (MRAM) and more specifically to the MRAM cell having aligned magnetic vectors.

BACKGROUND OF THE INVENTION

One type of magnetic memory cell uses multi-layer giant magnetoresistive materials (GMR) and utilizes submicron widths, in order to increase density. A conductive layer is disposed between the multi-layers of giant magnetoresistive material. In this structure the magnetization vectors are parallel to the length of the magnetic material instead of the width. In one embodiment the magnetization vector of one magnetic material layer is always maintained in one direction while the magnetization vector of the second magnetic layer switches between parallel and antiparallel to the first vector in order to represent both logical "0" and "1" states. In order to determine the logical state of a memory cell utilizing this material, the memory cell has a reference cell and an active cell. The reference cell always provides a voltage corresponding to one state (either always a "1" or always a "0"). The output of the reference cell is compared to the output of the active cell in order to determine the state of the memory cell. The requirement for an active and a reference cell reduces the density of a memory that utilizes such elements. Additionally, each memory cell requires transistors to switch the active and reference cells at appropriate times in order to read the cells. This further increases the cost of the memory.

In a non-volatile memory another magnetic memory cell is used which basically includes a finite dimension element of a giant magnetoresistive (GMR) material, a sense line, and a word line. The MRAM employs the GMR effect for memory operations. Magnetic vectors in one or all of the layers of GMR material are switched very quickly from one direction to an opposite direction when a magnetic field is applied to the GMR material over a certain threshold. According to the direction of the magnetic vectors in the GMR material, states are stored, for example, one direction can be defined as a logic "0", and another direction can be defined as a logic "1". The GMR material maintains these states even without a magnetic field being applied. In this type of device a sense current is passed through the cell along the longitudinal axis to read the stored state.

However, because ends of the layers of magnetic material form a discontinuity in magnetization distribution, very high fields and magnetic poles are formed at the discontinuity or ends of the layers. These high fields force magnetic vectors adjacent the ends to align approximately parallel to the discontinuities or ends. These end effects cause the resistance and switching characteristics of the cell to vary in accordance with the detailed distribution of the magnetic vectors adjacent the ends. This variation in resistance and switching characteristics can be sufficient to cause problems in the reading or sensing of stored states in the cell.

Accordingly, it is highly desirable to provide layers of magnetic material with non-varying magnetic end vectors and memory cells which utilize these layers.

It is a purpose of the present invention to provide new and improved layers of magnetic material for use in multi-state, multi-layer magnetic memory cell.

It is another purpose of the present invention to provide a new and improved multi-state, multi-layer magnetic memory cell with repeatable switching behavior.

It is a further purpose of the present invention to provide a new and improved multi-state, multi-layer magnetic memory cell which can be switched in the various states with a repeatable magnetic field.

It is a still further purpose of the present invention to provide a new and improved multi-state, multi-layer magnetic memory cell with a repeatable resistance in the various states.

It is yet another purpose of the present invention to provide a new and improved multi-state, multi-layer magnetic memory cell with a lower operating power.

SUMMARY OF THE INVENTION

The above problems and others are at least partially solved and the above purposes and others are realized in a layer of magnetic material having a width and a length being longer than the width of the layer, wherein magnetic vectors in the layer point along the length of the layer of magnetic material.

BRIEF DESCRIPTION OF THE DRAWINGS

Referring to the drawings.

DESCRIPTION OF THE PREFERRED EMBODIMENTS

Figure 1:
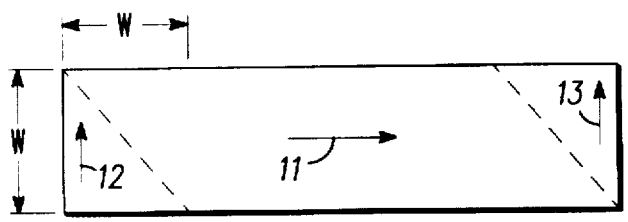
FIGS. 1 through 4 are views in top plan of a layer of magnetic material illustrating various possible magnetic end vector orientations.

Turning now to the drawings, FIGS. 1 through 4 are views in top plan of a layer 10 of magnetic material, illustrating various possible magnetic vector orientations. Referring specifically to FIG. 1, layer 10 has a width "W" less than a width of magnetic domain walls within the layer of magnetic material so as to restrict magnetic vector 11 in layer 10 to point substantially along the length of layer 10 of magnetic material. Magnetic vector 11 represents the major portion of the magnetic domain or domains in layer 10. However, because the ends of layer 10 form a discontinuity in the magnetic domains, very high fields and magnetic poles are formed at the discontinuity or ends of the layers. Discontinuities are not present along the sides of layer 10 since magnetic vector 11 is substantially parallel to the sides. The high fields at the ends of layer 10 cause magnetic vectors adjacent the ends, which are defined as minor magnetic end vectors, and which attempt to form a closed magnetic loop at the ends. While these minor magnetic end vectors are illustrated herein as a single magnetic end vector 12 at the left end and a single magnetic end vector 13 at the right end, for simplicity, it should be understood that each is composed of one or more smaller magnetic end vectors pointing in different directions. Also, for purposes of this disclosure the term "ends" will generally be defined to mean an area the width W of layer 10 and with a length equal to or less than the distance "W" (the width of layer 10) from the physical end, as illustrated in FIG. 1.

Figure 2:
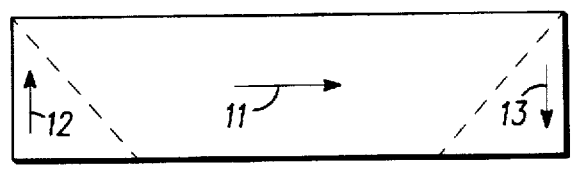
Figure 3:
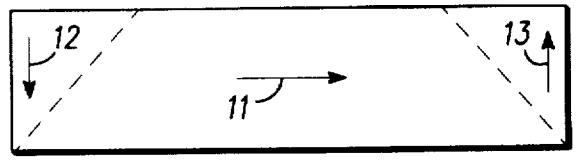
Figure 4:
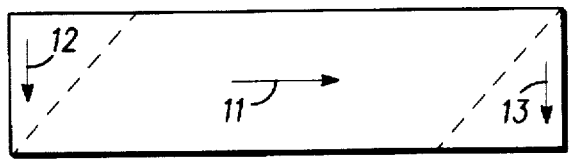

The problem that minor magnetic end vectors 12 and 13 present is that they are haphazardly positioned, generally approximately parallel to the discontinuities or ends of layer 10. For example: as seen in FIG. 1, both magnetic end vectors 12 and 13 are oriented upwardly; as seen in FIG. 2, end vector 12 is oriented upwardly while end vector 13 is oriented downwardly; as seen in FIG. 3, end vector 12 is oriented downwardly while end vector 13 is oriented upwardly; and as seen in FIG. 4, both end vectors 12 and 13 are oriented downwardly. In reality, since each of end vectors 12 and 13 may represent several minor magnetic end vectors, there may be a great many more possible orientations.

Each time magnetic vector 11 is switched, magnetic end vectors 12 and 13 can change position, or not, depending upon the magnetic field applied, the material, the previous position, etc. The problem is that each of the various possible positions of end vectors 12 and 13 result in changes of the resistance of layer 10, when used in a magnetic memory cell, as well as requiring different switching fields to produce switching in layer 10. That is, since each set of magnetic vectors 11, 12, and 13 require a certain magnitude of magnetic field to switch direction and since either or both of magnetic end vectors 12 and 13 may switch directions with magnetic vector 11, the magnitude of the magnetic field required to switch magnetic vector 11 may vary each time it is switched. The variation in resistance can be sufficient to cause problems in the reading or sensing of stored states in a magnetic memory cell and the variations in magnitude of the magnetic field required to switch states in the cell can cause switching problems, especially in large arrays, and will certainly use additional power, which can become substantial in large arrays.

Figure 5:
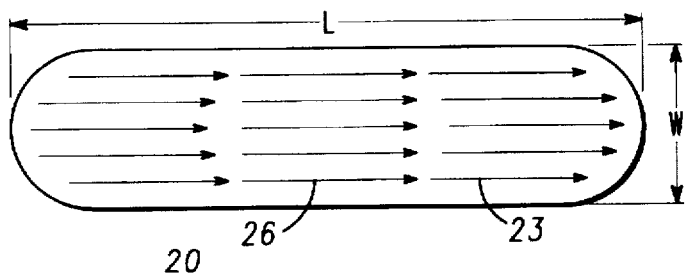
FIG. 5 is a view in top plan of a multi-layer magnetic memory cell having ellipsoidal ends.
Figure 6:
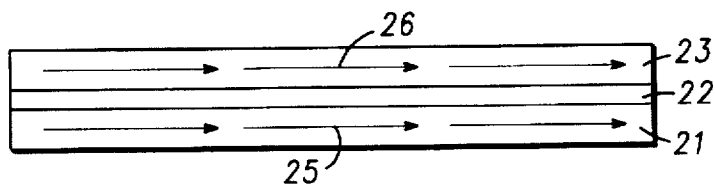
FIG. 6 is a sectional view of the multi-layer magnetic memory cell illustrated in FIG. 5.

Turning now to FIGS. 5 and 6, an enlarged view in top plan and a cross-sectional view, respectively, of a multi-layer magnetic memory material cell 20, having multiple layers of magnetic material that are ferromagnetically coupled, are illustrated. Cell 20 includes a first magnetic layer 21 and a second magnetic layer 23. Layers 21 and 23 are separated by a first spacer layer 22. Layer 22 can be either conductive or insulating. Magnetic layers 21 and 23 each can be single layers of magnetic materials such as a layer of nickel or iron or cobalt or alloys thereof. Any of layers 21 and 23 alternately can be a composite magnetic layer, such as a layer of nickel-iron-cobalt covering a layer of cobalt-iron. Materials that are suitable for layer 22 includes most conductive materials including copper, copper alloys, chromium, and chromium alloys, and insulating materials including Al oxides and nitrides as well as high energy band semiconductor. Also, although shown having two magnetic layers, cell 20 can have more than two magnetic layers including a third and a fourth magnetic layer that typically are similar to layers 21 and 23, and which are separated by second and third spacer layers similar to layer 22.

In the preferred embodiment, layers 21 and 23 are ellipsoid and are formed with the easy axis of magnetization along a length L and not along a width W of cell 20. In other embodiments, the easy axis can be along width W. Layers 21 and 23 each have major magnetization or magnetic vectors 25 and 26, respectively, that are substantially along the length L of cell 20, that is, substantially parallel to the length L of each layer 21 and 23. Layers 21 and 23 are coupled by a ferromagnetic coupling which allows magnetic vectors 25 and 26 to align in the same direction (either to the left or to the right in FIG. 6) in the absence of an external magnetic field. This ferromagnetic coupling is a function of the material and the thickness of layer 22.

Additionally width W is formed to be smaller than the width of the magnetic domain walls or transition width within layers 21 and 23. Consequently, magnetic vectors 25 and 26 cannot be parallel to width W. Typically, widths of less than 1.0 to 1.2 microns result in such a constraint. In the preferred embodiment, width W is less than one micron and is as small as can be made by manufacturing technology, and the length L is approximately twice width W at least. Generally, the greater the value of the length, the higher the output voltage of cell 20. Also in the preferred embodiment, layer 23 has a thickness that is approximately three to six nanometers and layer 21 has a thickness that is approximately four to ten nanometers. The difference in thicknesses between layers 21 and 23 affect the switching points of layers 21 and 23, providing a sensing or reading capability. In a specific example, layers 21 and 23 each are two layer structures including layers of cobalt-iron and nickel-iron-cobalt so that cobalt-iron is at the interface with conductive layer 22.

Figure 7:
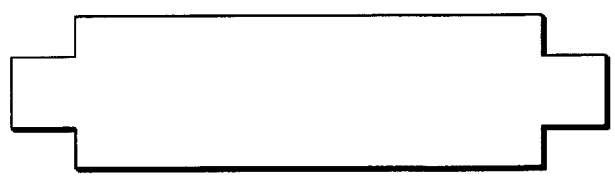
FIGS. 7 through 9 are views in top plan of a mask by which the multi-layer magnetic memory cell is formed.
Figure 8:
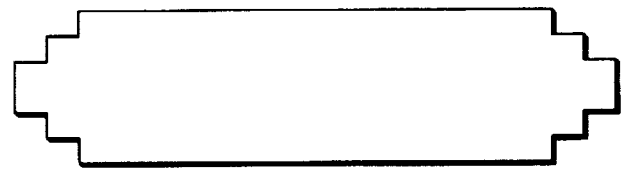
Figure 9:

In the preferred embodiment illustrated in FIGS. 5 and 6, layers 21 and 23 have ellipsoid ends. To make layers 21 and 23, photolithography masks shown in FIGS. 7 through 9 are utilized and the ellipsoidal shape is formed after exposure of photolithography. Layers 21 and 23 with ellipsoid ends uniformly distribute magnetic vectors 26 throughout cell 20. Particularly, magnetic vectors 25 and 26 in both ends of layers 21 and 23 aligned along the length L prevent from forming high fields and magnetic poles at the discontinuity or ends of the layers. This uniform magnetization distribution allows the resistance of cell 20 to be approximately constant when external magnetic field is applied to cell 20, thereby the reading and writing of states in cell 20 are steadily carried out. Furthermore, an extra magnetic field is unnecessary to switch states in cell 20 because of the constant resistance of cell 20. This results in saving an additional power supply. These results are accomplished by the smoothly curved ends of cell 20 which, in a specific example, are elliptically shaped.

Figure 10:
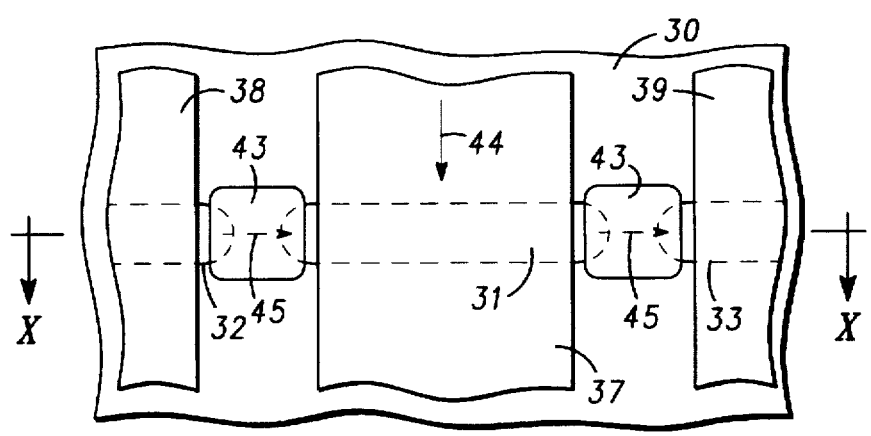
FIG. 10 is a view in top plan of an MRAM employing a multi-layer magnetic memory cell with an ellipsoidal end shape.
Figure 11:
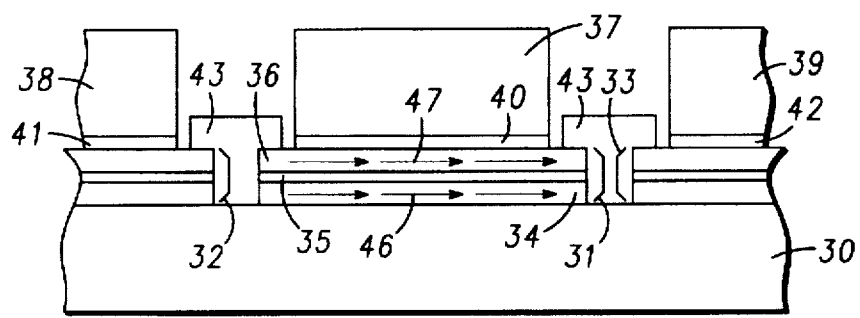
FIG. 11 is a sectional view of the multi-layer magnetic memory cell illustrated in FIG. 10.

Turning now to FIGS. 10 and 11, a view in top plan and a cross-sectional view as seen from the line X—X in FIG. 10, respectively, of a MRAM employing a multi-layer magnetic memory cell of conductive spacer layer with ellipsoidal end shapes are illustrated. A semiconductor substrate 30 of any convenient material is provided, and on which multi-layer magnetic memory material cells 31–33 are formed. Cell 31, which has the same structure as cell 20 shown in FIGS. 5 and 6, has the ellipsoidal shape at both ends of layers 34–36. Cells 32 and 33 also have the same structure as cell 31. Word lines 37–39 are formed on dielectric layers 40–42 which are deposited on cells 31–33, respectively. Sense line 43 is formed on substrate 30 and electrically coupled with an ohmic contact between cells 31 and 32, and between cells 31 and 33, respectively. Cells 31–33 and sense line 43 are arranged in series in which a sense current is provided to detect states contained in the cell.

In a writing operation, a word current 44 shown by a solid arrow is provided in word line 37 and a sense current 45 shown by a dashed arrow is provided in sense lines 43 in order to select cell 31. A total magnetic field generated by word current 44 and sense current 45, which is over a threshold, is applied to cell 31 along a length of cell 31, thereby magnetic vectors 46 and 47 in layers 34 and 36 are aligned along the length of cell 31.

In a reading operation, word current 44 and sense current 45 are provided in word line 37 and sense line 43, respectively. A value of sense current 45 is affected by a direction of magnetic vectors contained in cell 31. The changes of the current value are detected by an outside detection circuit (not shown) to determine states in cell 31.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. In a magnetic memory cell a layer of magnetic material having a width and a length being longer than the width of the layer, the magnetic memory cell comprising:

smoothly curved ends to prevent the formation of high fields and magnetic poles at any discontinuities; and the width of the layers being less than a width of a magnetic domain wall within the layer of magnetic material so that the magnetic vectors cannot point along the width;

wherein magnetic vectors in the layer point along the length of the layer of magnetic material.

2. In a magnetic memory cell a layer of magnetic material as claimed in claim 1 wherein the length of the layer is at least twice as long as the width of the layer of magnetic material.

3. In a magnetic memory cell a layer of magnetic material as claimed in claim 1 wherein the ends of the layer of magnetic material are elliptical.

4. A multi-layer, magnetic memory cell comprising:

a first layer of magnetic material having smoothly curved ends;

a layer of nonmagnetic material positioned on the first layer of magnetic material;

a second layer of magnetic material having smoothly curved ends positioned on the layer of nonmagnetic material so as to form a magnetic memory cell; and the magnetic memory cell having a width and a length with the width being less than a width of magnetic domain walls within the layers of magnetic material so as to restrict major magnetic vectors in the layers of magnetic material to point substantially along the length of the layers of magnetic material;

wherein magnetic vectors in the layer point along the length of the layer of magnetic material.

5. A multi-layer, magnetic memory cell as claimed in claim 4 wherein the width of the first and second layers are less than a width of a magnetic domain wall.

6. A multi-layer, magnetic memory cell as claimed in claim 4 wherein the length of the first and second layers are at least twice as long as the width of the first and second layers of magnetic material.

7. A multi-layer, magnetic memory cell as claimed in claim 4 wherein the ends of the first and second layers of magnetic material are elliptical.

* * * * *

UNITED STATES PATENT AND TRADEMARK OFFICE
CERTIFICATE OF CORRECTION

PATENT NO.    : 5,757,695
DATED         : May 26, 1998
INVENTOR(S)   : Shi et al.

It is certified that error appears in the above-identified patent and that said Letters Patent is hereby corrected as shown below:

<u>Column 1,</u>
Line 3, after the Title, please add as a new first paragraph the following paragraph:
    -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*